United States Patent
Song et al.

(10) Patent No.: US 10,636,465 B2
(45) Date of Patent: Apr. 28, 2020

(54) MAGNETIC MEMORY DEVICE AND METHOD OF FABRICATING THE SAME

(71) Applicant: Samsung Electronics Co., Ltd., Suwon-si, Gyeonggi-do (KR)

(72) Inventors: Yoonjong Song, Seoul (KR); Kilho Lee, Busan (KR); Daeeun Jeong, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/965,830

(22) Filed: Apr. 27, 2018

(65) Prior Publication Data

US 2018/0358070 A1    Dec. 13, 2018

(30) Foreign Application Priority Data

Jun. 9, 2017 (KR) .......................... 10-2017-0072690

(51) Int. Cl.
| | | |
|---|---|---|
| G11C 11/16 | (2006.01) | |
| H01L 43/12 | (2006.01) | |
| H01L 43/10 | (2006.01) | |
| H01L 43/02 | (2006.01) | |
| H01L 43/08 | (2006.01) | |

(52) U.S. Cl.
CPC ........ *G11C 11/161* (2013.01); *G11C 11/1659* (2013.01); *H01L 43/02* (2013.01); *H01L 43/08* (2013.01); *H01L 43/10* (2013.01); *H01L 43/12* (2013.01)

(58) Field of Classification Search
CPC ... G11C 11/161; G11C 11/1659; H01L 43/02; H01L 43/10; H01L 43/12
See application file for complete search history.

(56) References Cited

U.S. PATENT DOCUMENTS

| | | | |
|---|---|---|---|
| 7,473,951 B2 * | 1/2009 | Kim ...................... | B82Y 10/00 257/296 |
| 7,514,146 B2 * | 4/2009 | Noguchi ............... | C30B 25/105 204/192.1 |
| 8,445,981 B2 | 5/2013 | Lim et al. | |
| 8,941,195 B2 * | 1/2015 | Lee ........................ | H01L 43/08 257/421 |
| 9,210,939 B2 * | 12/2015 | Miyaishi ................ | B01J 27/055 |
| 9,257,637 B2 | 2/2016 | Guo | |
| 9,306,156 B2 * | 4/2016 | Noh ........................ | H01L 43/12 |
| 9,318,694 B2 | 4/2016 | Lamborn et al. | |
| 9,543,357 B2 | 1/2017 | Ko et al. | |
| 9,722,172 B2 | 8/2017 | Park et al. | |

(Continued)

*Primary Examiner* — Tri M Hoang
(74) *Attorney, Agent, or Firm* — Renaissance IP Law Group LLP

(57) ABSTRACT

Disclosed are a magnetic memory device and a method of fabricating the same. The magnetic memory device comprises a bottom electrode on a substrate, a magnetic tunnel junction pattern including a first magnetic layer, a tunnel barrier layer, and a second magnetic layer that are sequentially stacked on the bottom electrode, and a top electrode on the magnetic tunnel junction pattern. The bottom electrode comprises a first bottom electrode and a second bottom electrode on the first bottom electrode. Each of the first and second bottom electrodes comprises metal nitride. The first bottom electrode has a crystallinity higher than that of the second bottom electrode.

19 Claims, 10 Drawing Sheets

(56) References Cited

U.S. PATENT DOCUMENTS

| | | |
|---|---|---|
| 2005/0068834 A1 | 3/2005 | Kim et al. |
| 2007/0230067 A1 | 10/2007 | Jogo et al. |
| 2012/0018825 A1 | 1/2012 | Lim et al. |
| 2013/0126996 A1 | 5/2013 | Jeong |
| 2014/0217527 A1 | 8/2014 | Guo |
| 2015/0188033 A1 | 7/2015 | Lamborn et al. |
| 2016/0020249 A1 | 1/2016 | Ko et al. |
| 2016/0149120 A1 | 5/2016 | Park et al. |
| 2017/0047375 A1 | 2/2017 | Kanaya |

\* cited by examiner

MAGNETIC MEMORY DEVICE AND METHOD OF FABRICATING THE SAME

CROSS-REFERENCE TO RELATED APPLICATION

This application claims priority under 35 U.S.C § 119 to Korean Patent Application No. 10-2017-0072690, filed on Jun. 9, 2017 in the Korean Intellectual Property Office, the disclosure of which is incorporated by reference herein in its entirety.

TECHNICAL FIELD

The present inventive concepts relate to a magnetic memory device and a method of fabricating the same.

DISCUSSION OF RELATED ART

Magnetic memory devices have been developed as memory devices. The magnetic memory devices operate at a high speed with nonvolatile characteristics. The magnetic memory devices include spin transfer torque magnetic random access memory (STT-MRAM) devices of which write current decreases with decreasing size of magnetic cells.

SUMMARY

According to exemplary embodiments of the present inventive concepts, a magnetic memory device is provided as follows. A bottom electrode is on a substrate. A magnetic tunnel junction pattern includes a first magnetic pattern, a tunnel barrier pattern, and a second magnetic pattern that are sequentially stacked on the bottom electrode. A top electrode is on the magnetic tunnel junction pattern. The bottom electrode includes a first bottom electrode and a second bottom electrode on the first bottom electrode. Each of the first and second bottom electrodes includes metal nitride. The first bottom electrode has a crystallinity higher than that of the second bottom electrode.

According to exemplary embodiments of the present inventive concepts, a magnetic memory device is provided as follows. A bottom electrode is on a substrate. A magnetic tunnel junction pattern includes a first magnetic pattern, a tunnel barrier pattern, and a second magnetic pattern that are sequentially stacked on the bottom electrode. A top electrode is on the magnetic tunnel junction pattern. The bottom electrode includes a first bottom electrode and a second bottom electrode on the first bottom electrode. Each of the first and second bottom electrodes includes metal nitride. The second bottom electrode is thinner than the first bottom electrode.

According to exemplary embodiments of the present inventive concepts, a method of fabricating a magnetic memory device is provided as follows. A contact plug is formed on a substrate. A preliminary first bottom electrode layer is formed on the contact plug. A planarization process is performed on the preliminary first bottom electrode layer to form a first bottom electrode layer. A second bottom electrode layer is formed on the first bottom electrode layer. A magnetic tunnel junction layer and a top electrode layer are formed on the second bottom electrode layer. The first and second bottom electrode layers, the magnetic tunnel junction layer, and the top electrode layer are patterned.

BRIEF DESCRIPTION OF THE DRAWINGS

These and other features of the present inventive concept will become more apparent by describing in detail exemplary embodiments thereof with reference to the accompanying drawings of which:

FIGS. 7, 8A to 10A, and 11 to 13 illustrate cross-sectional views taken along line I-I' of FIG. 6, showing a method of fabricating a magnetic memory device according to exemplary embodiments of the present inventive concepts;

DETAILED DESCRIPTION OF EXEMPLARY EMBODIMENTS

As used herein, singular "a," "an," and "the" are intended to cover the plural forms as well, unless the context clearly indicates otherwise.

Figure 1:
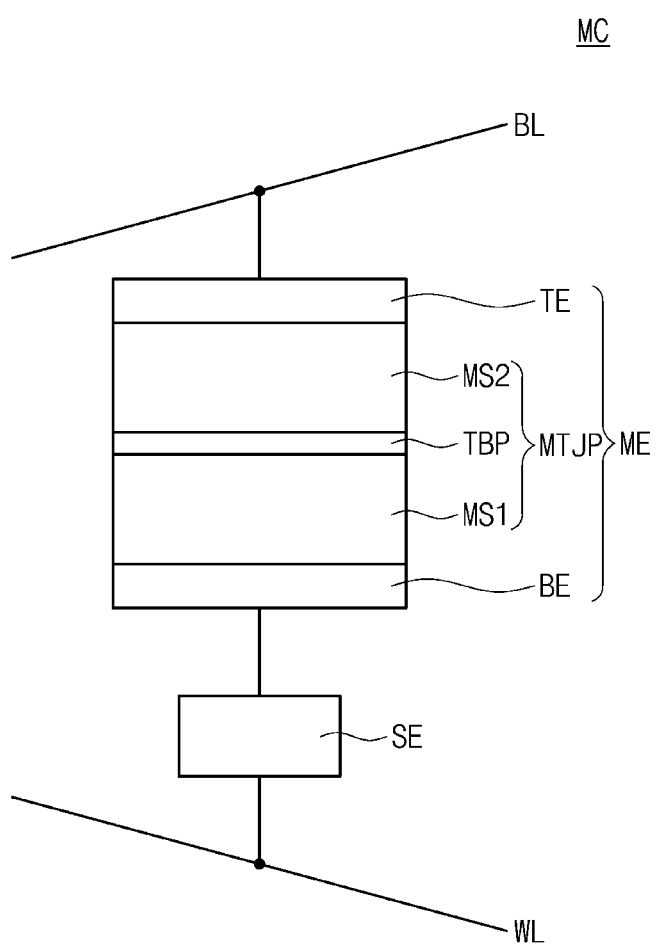
FIG. 1 illustrates a conceptual diagram showing a unit memory cell of a magnetic memory device including a magnetic tunnel junction pattern according to exemplary embodiments of the present inventive concepts.

FIG. 1 illustrates a conceptual diagram showing a unit memory cell of a magnetic memory device including a magnetic tunnel junction pattern according to exemplary embodiments of the present inventive concepts.

Referring to FIG. 1, a unit memory cell MC includes a memory element ME and a select element SE that are disposed between a bit line BL and a word line WL crossing each other. The memory element ME includes a bottom electrode BE, a magnetic tunnel junction pattern MTJP, and a top electrode TE. The memory element ME and the select element SE are electrically connected in series to each other.

The select element SE may selectively control a charge flow passing through the magnetic tunnel junction pattern MTJP. For example, the select element SE may be one of a diode, a PNP bipolar transistor, an NPN bipolar transistor, an NMOS (N-type metal-oxide-semiconductor) field effect transistor, and a PMOS (P-type metal-oxide-semiconductor) field effect transistor. When the select element SE is configured as a three-terminal device such as a bipolar transistor or a MOS field effect transistor, an additional interconnect line may be connected to the select element SE. The magnetic tunnel junction pattern MTJP includes a first magnetic pattern MS1, a second magnetic pattern MS2, and a tunnel barrier pattern TBP therebetween. Each of the first and second magnetic patterns MS1 and MS2 may include at least one magnetic layer.

One of the first and second magnetic patterns MS1 and MS2 may have a magnetization direction that is fixed regardless of an external magnetic field under a normal use environment. In this description, a pinned layer is intended to refer to a magnetic layer having the fixed magnetic characteristics. The other of the first and second magnetic patterns MS1 and MS2 may have a magnetization direction that is switched by an external magnetic field applied thereto. In this description, a free layer is intended to refer to a magnetic layer having the reversible magnetic characteristics. The magnetic tunnel junction pattern MTJP may have an electrical resistance depending on a relative orientation of magnetization directions of the free and pinned layers. For example, the electrical resistance of the magnetic tunnel junction pattern MTJP may be much greater when the magnetization directions of the free and pinned layers are antiparallel than when the magnetization directions of the free and pinned layers are parallel. Consequently, the electrical resistance of the magnetic tunnel junction pattern MTJP may be controlled by changing the magnetization direction of the free layer, and this difference in resistance may be used as a data storage mechanism for magnetic memory devices according to exemplary embodiments of the present inventive concepts. The tunnel barrier pattern TBP and the first and second magnetic patterns MS1 and MS2 will be further discussed in detail with reference to FIGS. 14 and 15.

Figure 2:
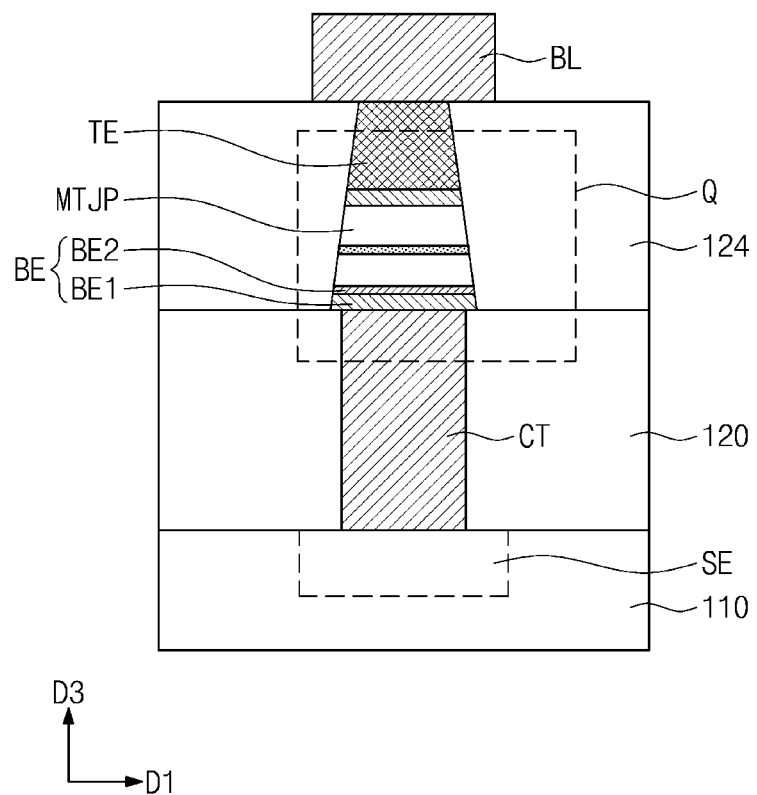
FIG. 2 illustrates a cross-sectional view showing a unit memory cell of a magnetic memory device including a magnetic tunnel junction pattern according to exemplary embodiments of the present inventive concepts.
Figure 3:
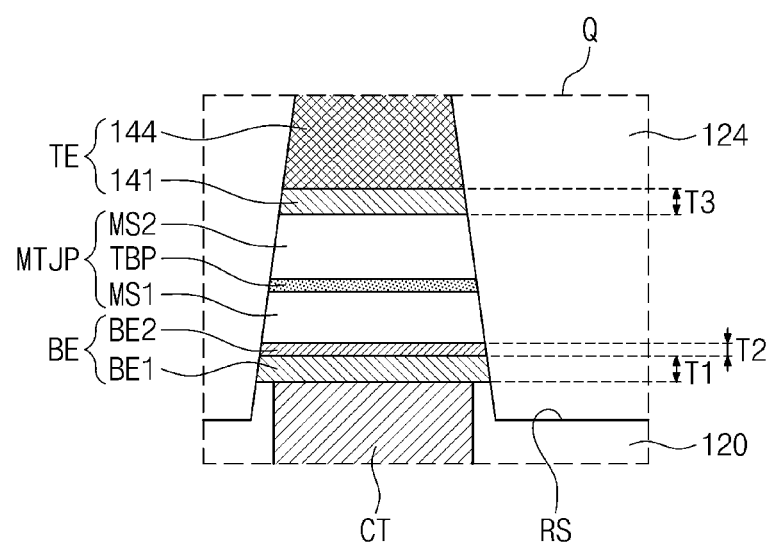
FIG. 3 illustrates an enlarged view showing section Q of FIG. 2.
Figure 4:
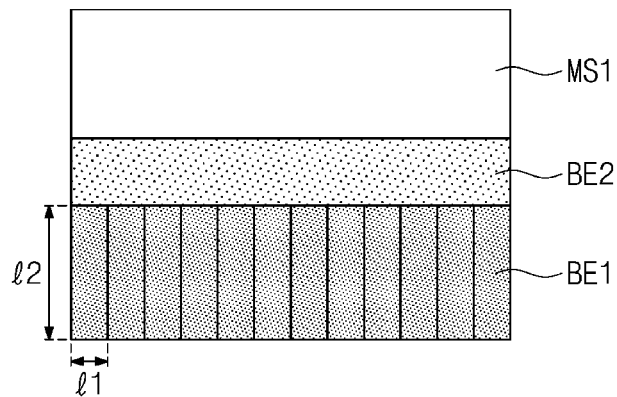
FIG. 4 illustrates a conceptual diagram showing a crystalline structure of a bottom electrode.

FIG. 2 illustrates a cross-sectional view showing a unit memory cell of a magnetic memory device including a magnetic tunnel junction pattern according to exemplary embodiments of the present inventive concepts. FIG. 3 illustrates an enlarged view showing section Q of FIG. 2. FIG. 4 illustrates a conceptual diagram showing a crystalline structure of a bottom electrode.

Referring to FIGS. 2 and 3, a substrate 110 is provided. For example, the substrate 110 may be a silicon substrate, a silicon-on-insulator (SOI) substrate, or a germanium substrate. The substrate 110 may include a select element SE. For example, the select element SE may be a selection device including a word line.

A contact plug CT is connected to the select element SE. A terminal of the select element SE may be coupled to the contact plug CT that penetrates a first interlayer dielectric layer 120 on the substrate 110. The contact plug CT may include doped semiconductor material (e.g., doped silicon), metal (e.g., tungsten, titanium, or tantalum), conductive metal nitride (e.g., titanium nitride, tantalum nitride, or tungsten nitride), or metal-semiconductor compound (e.g., metal silicide). A bottom electrode BE, a magnetic tunnel junction pattern MTJP, and a top electrode TE are sequentially provided on the contact plug CT.

The bottom electrode BE includes a first bottom electrode BE1 and a second bottom electrode BE2 on the first bottom electrode BE1. The first bottom electrode BE1 may have a crystallinity higher than that of the second bottom electrode BE2. In this description, the crystallinity may refer to the degree of structural order. For example, a poly-crystal structure is more crystalline than an amorphous structure; and a single-crystal structure is more crystalline than an amorphous structure. In a poly-crystal structure, the larger grains of the poly-crystal structure, the more the crystallinity The crystallinity may be measured by an FWHM (Full Width at Half Maximum) of XRD (X-Ray Diffraction) intensity peak. The first bottom electrode BE1 may have an FWHM less than that of the second bottom electrode BE2.

The first and second bottom electrodes BE1 and BE2 may include metal nitride. For example, the first and second bottom electrodes BE1 and BE2 may be formed of metal nitride. When the first bottom electrode BE1 includes nitride of a first metal and the second bottom electrode BE2 includes nitride of a second metal, the second metal may be an element whose an atomic mass is greater than that of the first metal.

The first bottom electrode BE1 may include metal nitride having an NaCl crystalline structure. For example, the first bottom electrode BE1 may include TiN. The first bottom electrode BE1 may have a stoichiometric or non-stoichiometric ratio between metal (Ti, for example) and nitrogen elements. The first bottom electrode BE1 may, as illustrated in FIG. 4, have a columnar structure whose major axis extends in a vertical direction in which the bottom electrode BE, the magnetic tunnel junction pattern MTJP, and the top electrode TE are stacked on the contact plug CT in the listed order. For example, each grain of the first bottom electrode BE1 has a length 12 in a third direction D3 greater than a width 11 in a first direction D1. The third direction may be parallel to the vertical direction, and the first direction D1 may be in parallel to a top surface of the substrate 110. For example, the length 12 in the third direction D3 may be more than about three times the width 11 in the first direction D1. In exemplary embodiments, the first bottom electrode BE1 may substantially be formed of the grains having the length 12 and the width 11 with various size of grains (not shown), depending on a process condition of depositing the first bottom electrode BE1 on the contact plug CT of FIG. 2. For the convenience of description, FIG. 4 is exaggerated so that a single size of a grain is shown.

For example, the second bottom electrode BE2 may be amorphous. For example, the second bottom electrode BE2 may be formed of amorphous metal nitride including TaN or WN. The second bottom electrode BE2 has a thickness T2 less than a thickness T1 of the first bottom electrode BEL For example, the thickness T1 of the first bottom electrode BE1 may be about 2 times to about 10 times the thickness T2 of the bottom electrode BE2. The thickness T1 of the first bottom electrode BE1 may be in the range from about 50 Å to about 300 Å. The thickness T2 of the second bottom electrode BE2 may be in the range from about 10 Å to about 100 Å.

The magnetic tunnel junction pattern MTJP includes a first magnetic pattern MS1, a second magnetic pattern MS2, and a tunnel barrier pattern TBP therebetween. The bottom electrode BE, the magnetic tunnel junction pattern MTJP, and the top electrode TE are provided in a second interlayer dielectric layer 124. The first interlayer dielectric layer 120 and the second interlayer dielectric layer 124 may include, for example, silicon oxide, silicon nitride, or silicon oxynitride.

The top electrode TE may include a metal nitride pattern 141 and a metal pattern 144 on the metal nitride pattern 141. A bit line BL is provided on the top electrode TE. The metal nitride pattern 141 may increase adhesion between the metal pattern 144 and the magnetic tunnel junction pattern MTJP. The metal pattern 144 may be a layer including metal elements such as tungsten, titanium, or tantalum. For example, the metal nitride pattern 141 may be a layer including nitride of tungsten, titanium, or tantalum. The metal nitride pattern 141 may include a material that is the same as that of the first bottom electrode BE1 and different from that of the second bottom electrode BE2. For example, the metal nitride pattern 141 may include TiN. The metal nitride pattern 141 may have a thickness T3 greater than the thickness T2 of the second bottom electrode BE2. The thickness T3 of the metal nitride pattern 141 may be greater than the thickness T1 of the first bottom electrode BEL For example, the thickness T3 of the metal nitride pattern 141 may be in the range from about 60 Å to about 400 Å.

The metal pattern 144 may be thicker than the metal nitride pattern 141. For example, the metal pattern 144 may have a thickness about 2 times to about 7 times that of the metal nitride pattern 141. The thickness of the metal pattern 144 may be in the range from about 250 Å to about 500 Å. The magnetic tunnel junction pattern MTJP may be thicker than the metal pattern 144. For example, the magnetic tunnel junction pattern MTJP may have a thickness about 1.5 times to about 2 times that of the metal pattern 144. The thickness of the magnetic tunnel junction pattern MTJP may be in the range from about 450 Å to about 800 Å.

The top electrode TE, the magnetic tunnel junction pattern MTJP, and the bottom electrode BE may each have a decreasing width from the bottom electrode BE to the top electrode TE. The width is measured in the first direction. The first interlayer dielectric layer 120 is provided at its upper portion with a recess region RS recessed below a top surface of the contact plug CT.

Figure 5:
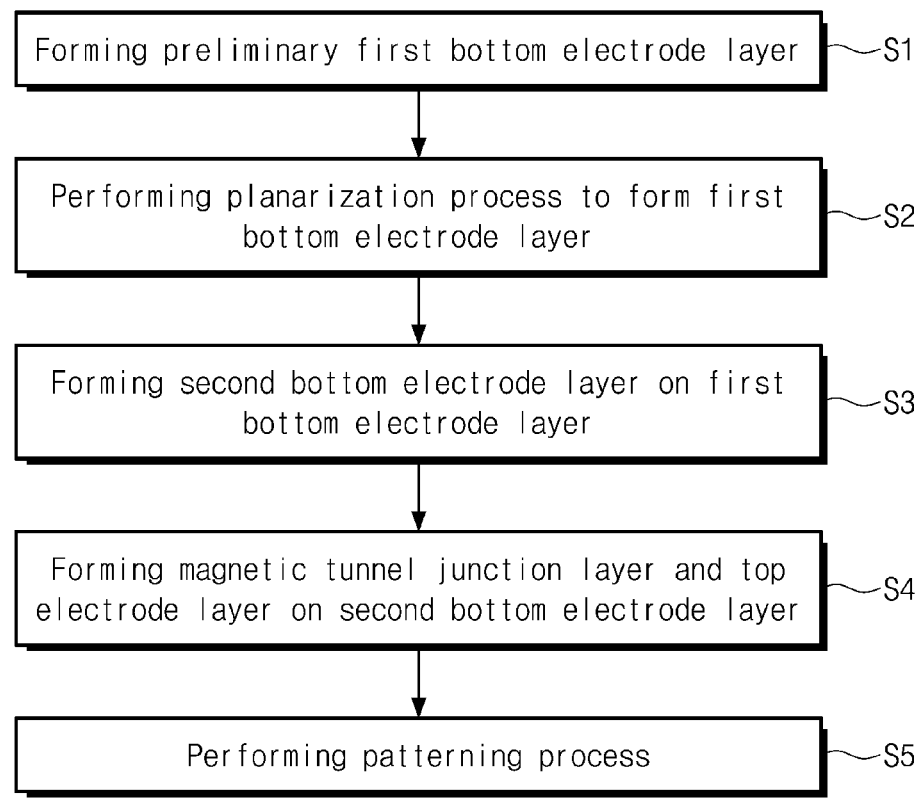
FIG. 5 illustrates a flow chart showing a method of fabricating a magnetic memory device according to exemplary embodiments of the present inventive concepts.
Figure 6:
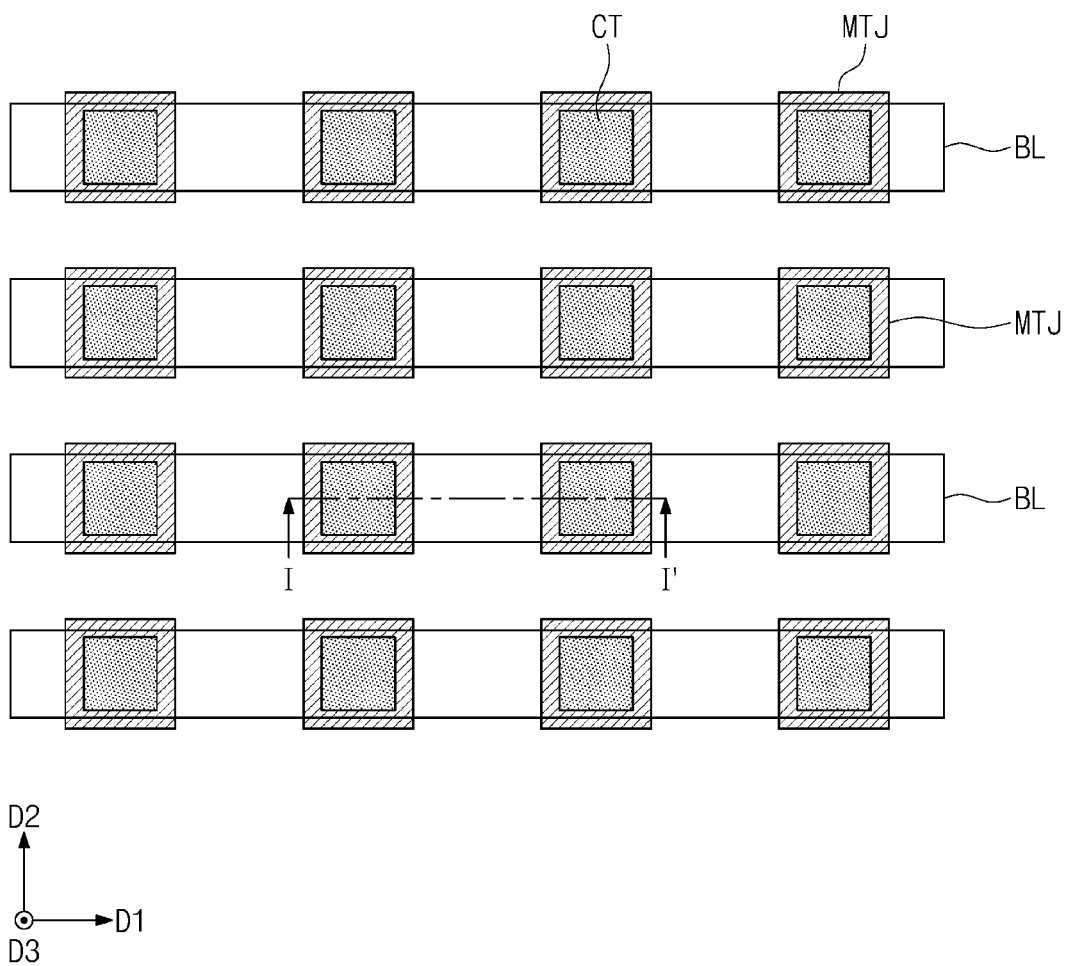
FIG. 6 illustrates a plan view showing a method of fabricating a magnetic memory device according to exemplary embodiments of the present inventive concepts.
Figure 8A:
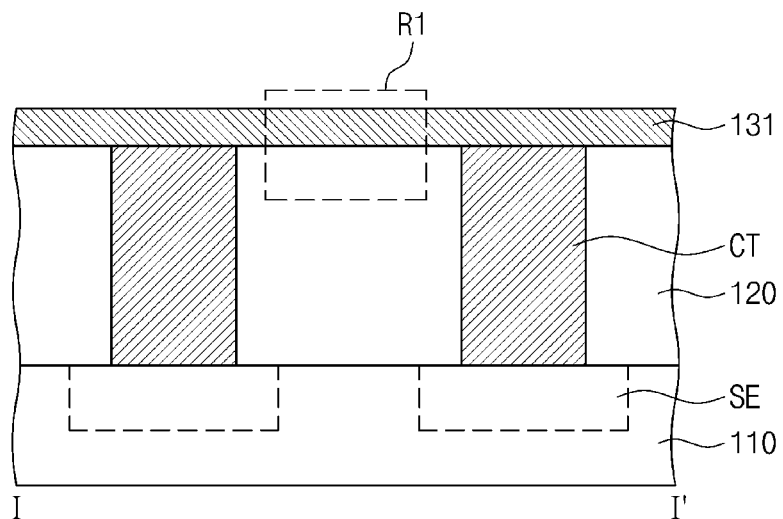
Figure 8B:
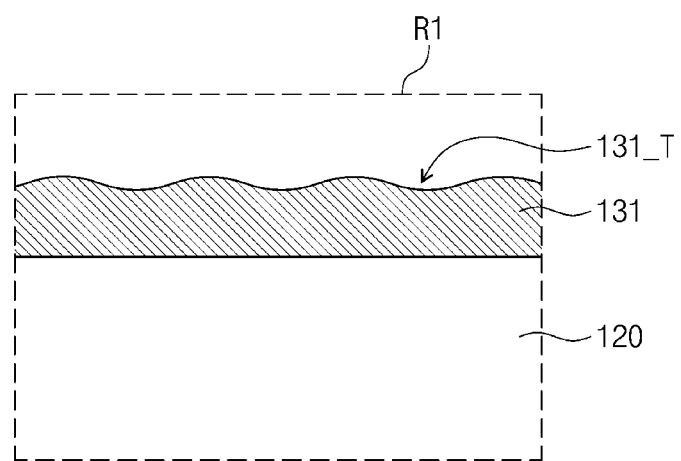
FIGS. 8B, 9B, and 10B illustrate enlarged views showing sections R1, R2, and R3 of FIGS. 8A, 9A, and 10A, respectively.
Figure 9A:
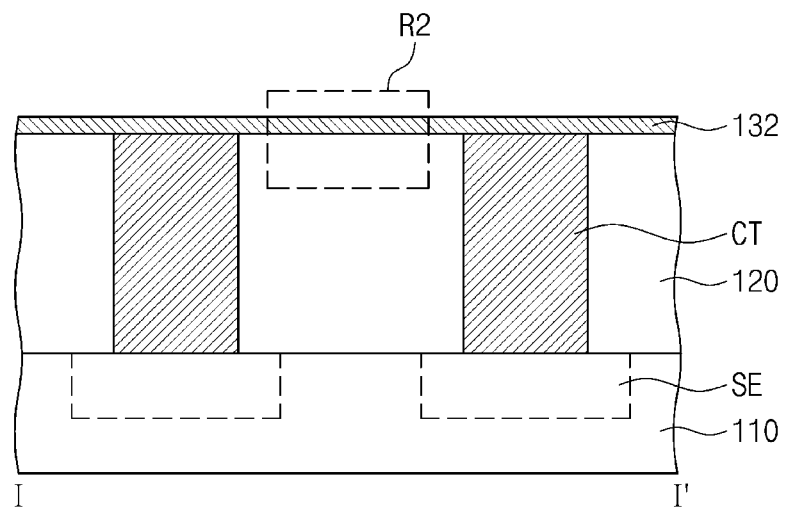
Figure 9B:
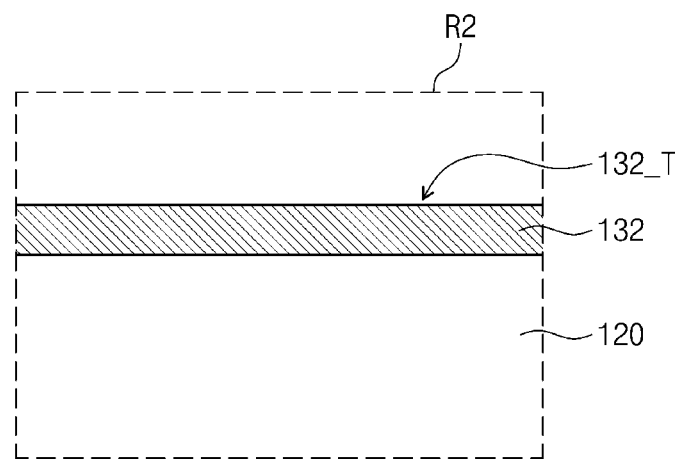
Figure 10A:
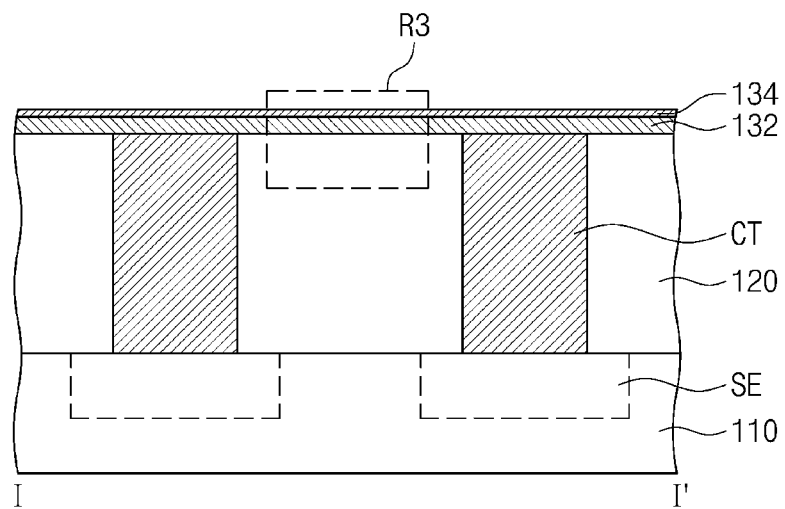
Figure 10B:
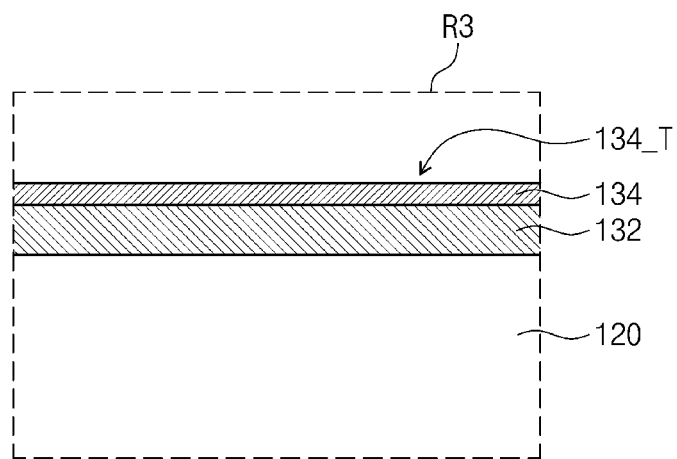

FIG. 5 illustrates a flow chart showing a method of fabricating a magnetic memory device according to exemplary embodiments of the present inventive concepts. FIG. 6 illustrates a plan view showing a method of fabricating a magnetic memory device according to exemplary embodiments of the present inventive concepts. FIGS. 7, 8A to 10A, and 11 to 13 illustrate cross-sectional views taken along line I-I' of FIG. 6, showing a method of fabricating a magnetic memory device according to exemplary embodiments of the present inventive concepts. FIGS. 8B, 9B, and 10B illustrate enlarged views showing sections R1, R2, and R3 of FIGS. 8A, 9A, and 10A, respectively.

Figure 7:
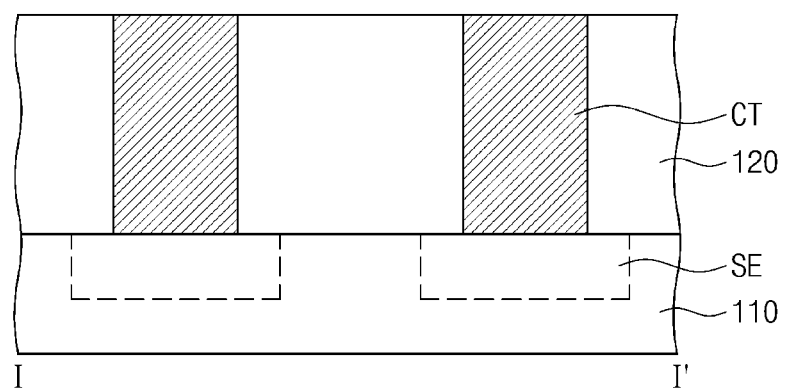

Referring to FIGS. 6 and 7, a first interlayer dielectric layer 120 is provided on a substrate 110. The substrate 110 may be a semiconductor substrate including silicon, silicon on insulator (SOI), silicon-germanium (SiGe), germanium (Ge), or gallium-arsenic (GaAs). A select element SE is provided on the substrate 110, and the first interlayer dielectric layer 120 covers the select element SE. The select element SE may be a field effect transistor or a diode. The first interlayer dielectric layer 120 may include oxide, nitride, or oxynitride. For example, the first interlayer dielectric layer 120 may include silicon oxide, silicon nitride, silicon carbide, or aluminum oxide.

A contact plug CT is provided in the first interlayer dielectric layer 120. The contact plug CT penetrates the first interlayer dielectric layer 120 and thus be electrically connected to the select element SE. Contact holes may be formed in the first interlayer dielectric layer 120, and the contact holes may be filled with a conductive material to form the contact plug CT. The contact plug CT may include doped semiconductor (e.g., doped silicon), metal (e.g., tungsten, titanium, or tantalum), conductive metal nitride (e.g., titanium nitride, tantalum nitride, or tungsten nitride), and metal-semiconductor compound (e.g., metal silicide). The contact plug CT has a top surface substantially coplanar with that of the first interlayer dielectric layer 120 at the same height from a top surface of the substrate 110.

Referring to FIGS. 5, 6, 8A, and 8B, a preliminary first bottom electrode layer 131 is formed on the contact plug CT (S1). The preliminary first bottom electrode layer 131 is formed to cover the contact plug CT. The preliminary first bottom electrode layer 131 may be a conductive layer whose crystallinity is higher than that of a second bottom electrode layer which will be discussed below. For example, the preliminary first bottom electrode layer 131 may, as illustrated in FIG. 4, have a columnar structure whose major axis extends in a vertical direction. The preliminary first bottom electrode layer 131 may have a thickness in the range from about 100 Å to about 500 Å.

The high crystallinity of the preliminary first bottom electrode layer 131 may allow the preliminary first bottom electrode layer 131 to have a relatively high surface roughness on its top surface 131_T. For example, when the preliminary first bottom electrode layer 131 has a columnar structure, the surface roughness may increase due to height difference between top surfaces of grains of the preliminary first bottom electrode layer 131. For example, the surface roughness may increase as the size of a grain in the preliminary first bottom electrode layer 131 increases.

The preliminary first bottom electrode layer 131 may be a metal nitride layer. For example, the preliminary first bottom electrode layer 131 may include TiN. For example, the preliminary first bottom electrode layer 131 may have an NaCl crystalline structure. The preliminary first bottom electrode layer 131 may be formed by sputtering.

Referring to FIGS. 5, 6, 9A, and 9B, the preliminary first bottom electrode layer 131 may experience a planarization process, thereby forming a first bottom electrode layer 132 (S2). For example, the planarization process may include chemical mechanical polishing. The first bottom electrode layer 132 may have a top surface 132_T whose surface roughness is lower than that of the top surface 131_T of the preliminary first bottom electrode layer 131, as illustrated in FIG. 9B. The first bottom electrode layer 132 may have a thickness less than that of the preliminary first bottom electrode layer 131 that does not yet experience the planarization process. For example, the thickness of the first bottom electrode layer 132 may be in the range from about 50 Å to about 300 Å.

Referring to FIGS. 5, 6, 10A, and 10B, a second bottom electrode layer 134 is formed on the first bottom electrode layer 132 (S3). The second bottom electrode layer 134 may be a conductive layer whose crystallinity is lower than that of the first bottom electrode layer 132. For example, the second bottom electrode layer 134 may be amorphous. The low crystallinity of the second bottom electrode layer 134 may allow the second bottom electrode layer 134 to have on its top surface 134_T a surface roughness lower than that of the first bottom electrode layer 132. The second bottom electrode layer 134 may be formed to have a flat surface even without a planarization process.

The second bottom electrode layer 134 may be a metal nitride layer. For example, the second bottom electrode layer 134 may include TaN or WN. Likewise the first bottom electrode layer 132, the second bottom electrode layers 134 may include a metal nitride layer, and thereby high interface coherence may be provided at an interface between the first bottom electrode layer 132 and the second bottom electrode layer 134. For example, when the contact plug CT is formed of a metal layer such as tungsten instead of metal nitride, an interfacial joint density may be lower at an interface between the first bottom electrode layer 132 and the second bottom electrode layer 134 than at an interface between the contact plug CT and the first bottom electrode layer 132. Accordingly, a magnetic memory device may increase in electrical characteristics.

The second bottom electrode layer 134 may be formed by sputtering. The second bottom electrode layer 134 may be formed thinner than the first bottom electrode layer 132. For example, the second bottom electrode layer 134 may have a thickness in the range from about 10 Å to about 100 Å.

The first bottom electrode layer 132 and the second bottom electrode layer 134 may act complimentary to each other. The first bottom electrode layer 132 may produce at an interface with its underlying first interlayer dielectric layer 120 a chemically stable compound that is easily etched. For example, when first metal oxynitride is produced at an interface between the first bottom electrode layer 132 and the first interlayer dielectric layer 120 and second metal oxynitride is produced at an interface between the second bottom electrode layer 134 and the first interlayer dielectric layer 120, the first metal oxynitride may have chemical stability higher than that of the second metal oxynitride. For example, the first metal oxynitride may be titanium oxynitride, and the second metal oxynitride may be tantalum oxynitride. When the first bottom electrode layer 132 and the second bottom electrode layer 134 undergo a patterning process which will be discussed below, an electrode separation may be easily performed between neighboring cells with the high chemically stability of the first metal oxynitride. In addition, an etching by-product may be rarely re-deposited on a sidewall of a magnetic tunnel junction pattern.

Magnetic layers constituting a magnetic tunnel junction pattern may have magnetic and electrical properties that are dependent on crystallographic characteristics of the magnetic layers. The low crystallinity of the second bottom electrode layer 134 may improve crystallographic characteristics of a magnetic tunnel junction pattern which will be discussed below. For example, the second bottom electrode layer 134 may have no or little effect on crystallinity of magnetic layers formed thereon. In addition, the second bottom electrode layer 134 may prevent crystallographic characteristics from being transferred to the magnetic layers from the first bottom electrode layer 132 whose crystallinity is relatively high. For example, the second bottom electrode layer 134 may inhibit the transfer of the columnar structure to the magnetic layer from the first bottom electrode layer 132.

Figure 11:
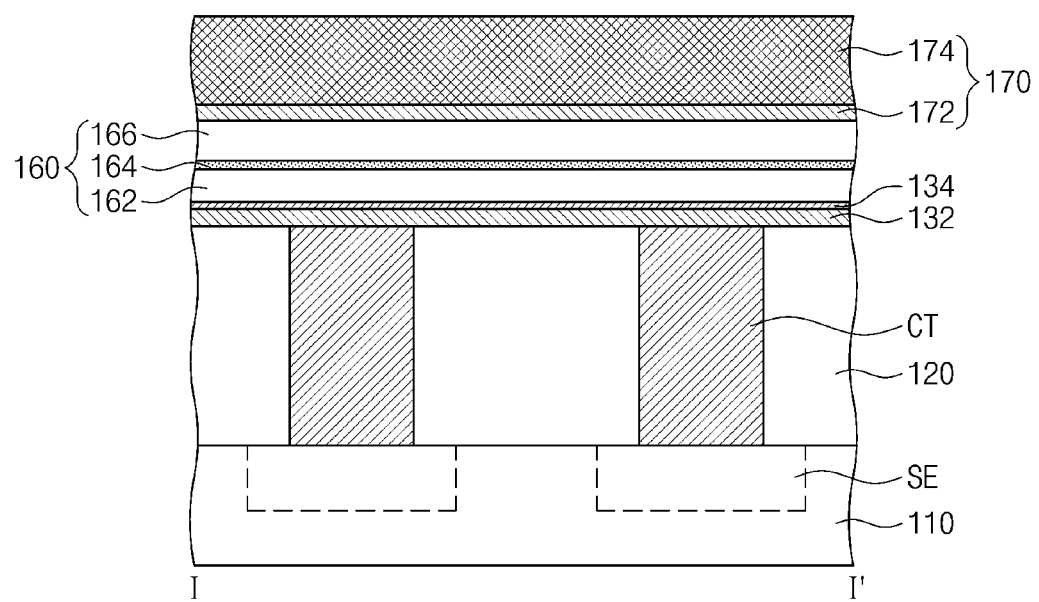

Referring to FIGS. 5, 6, and 11, a magnetic tunnel junction layer 160 and a top electrode layer 170 are formed on the second bottom electrode layer 134 (S4). As discussed above, the second bottom electrode layer 134 may prevent the crystallographic characteristics of the first bottom electrode layer 132 from being transferred from the first bottom electrode layer 132 to the magnetic tunnel junction layer 160. The magnetic tunnel junction layer 160 may include a first magnetic layer 162, a tunnel barrier layer 164, and a second magnetic layer 166 that are sequentially stacked on the second bottom electrode layer 134. For example, the first magnetic layer 162, the tunnel barrier layer 164, and the second magnetic layer 166 are vertically stacked on top surfaces of the contact plug CT and the first interlayer dielectric layer 120. One of the first magnetic layer 162 and the second magnetic layer 166 may be a reference layer having a unidirectionally fixed magnetization direction, and the other of the first magnetic layer 162 and the second magnetic layer 166 may be a free layer having a magnetization direction that may be changed to be parallel or antiparallel to the fixed magnetization direction.

For example, the magnetization directions of the reference and free layers may be substantially perpendicular to an interface between the tunnel barrier layer 164 and the second magnetic layer 166. Alternatively, the magnetization directions of the reference and free layers may be substantially parallel to the interface between the tunnel barrier layer 164 and the second magnetic layer 166. The magnetization directions of the reference and free layer will be further discussed in detail below with reference to FIGS. 14 and 15. Each of the first magnetic layer 162, the tunnel barrier layer 164, and the second magnetic layer 166 may be formed by sputtering, physical vapor deposition, or chemical vapor deposition.

The top electrode layer 170 includes a metal nitride layer 172 and a metal layer 174. For example, the metal nitride layer 172 may be formed of nitride of tungsten, titanium, or tantalum. For example, the metal layer 174 may be formed of a metallic material such tungsten, titanium, or tantalum.

Figure 12:
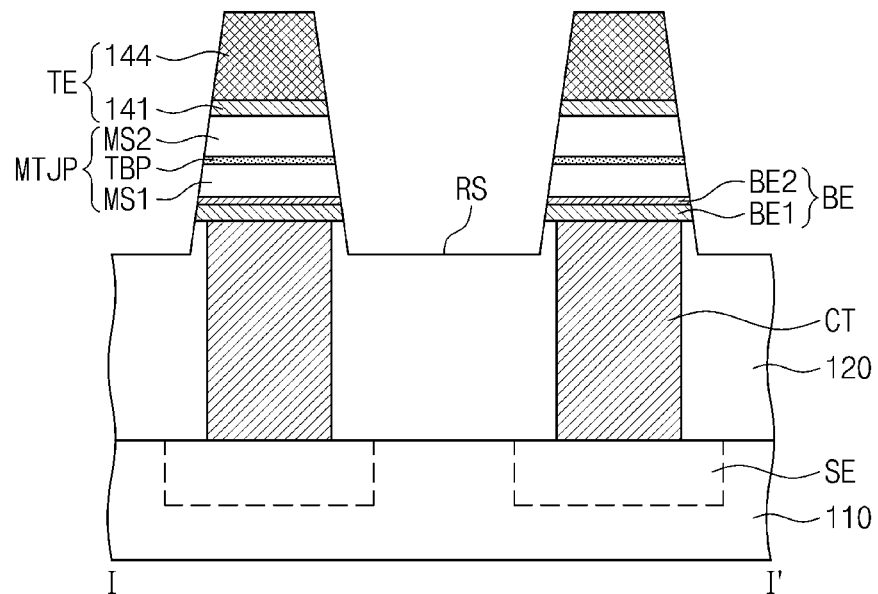

Referring to FIGS. 5, 6, and 12, a patterning process is performed (S5). The patterning process may include an ion beam etching process. The top electrode layer 170 may be patterned to form a top electrode TE. The top electrode TE includes a metal nitride pattern 141 and a metal pattern 144 on the metal nitride pattern 141. The top electrode TE may be used as a mask to pattern the magnetic tunnel junction layer 160, the first bottom electrode layer 132 and the second bottom electrode layer 134 that are disposed below the top electrode TE. Thus, a bottom electrode BE and a magnetic tunnel junction pattern MTJP may be formed. The bottom electrode BE includes a first bottom electrode BE1 and a second bottom electrode BE2. The magnetic tunnel junction pattern MTJP includes a first magnetic pattern MS1, a tunnel barrier pattern TBP, and a second magnetic pattern MS2.

When the patterning process is performed, a recess region RS is formed at an upper portion of the first interlayer dielectric layer 120. As discussed above, the first bottom electrode layer 132 may produce at an interface between its underlying first interlayer dielectric layer 120 a chemically stable compound that is easily etched. As a result, an easy electrode separation may be carried out between neighboring memory cells in the patterning process. A top surface of the recess region RS is formed flat. In addition, an etching by-product of the patterning process may be rarely re-deposited on sidewalls of the magnetic tunnel junction pattern MTJP.

Figure 13:
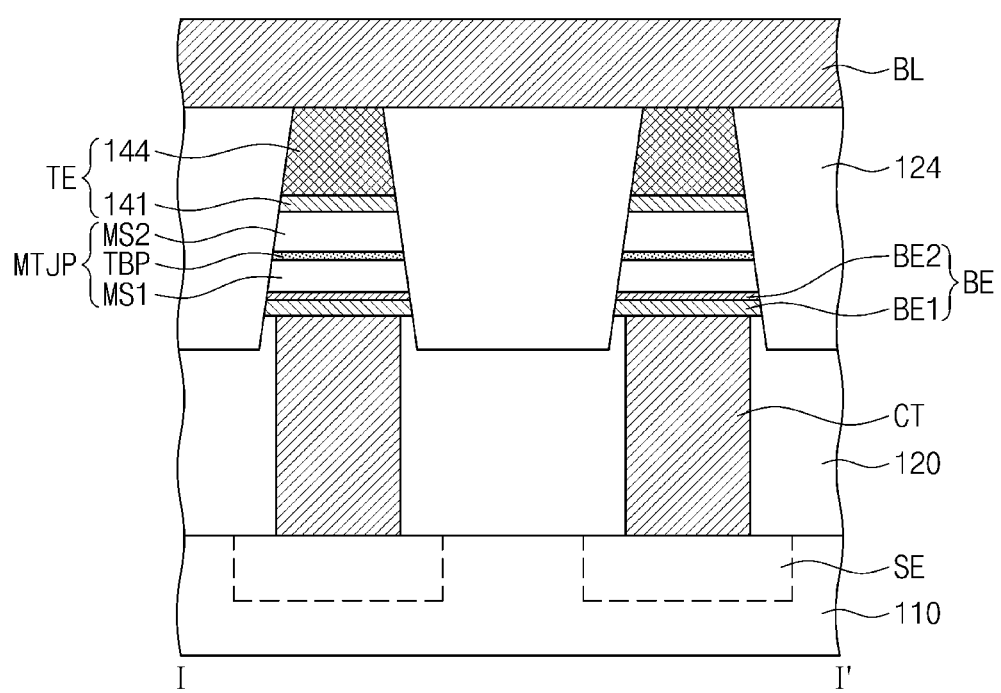

Referring to FIGS. 5, 6, and 13, a second interlayer dielectric layer 124 is formed to cover sidewalls of the bottom electrode BE, sidewalls of the magnetic tunnel junction pattern MTJP, and sidewalls of the top electrode TE. For example, the second interlayer dielectric layer 124 may be formed of, for example, silicon oxide, silicon nitride, or silicon oxynitride. The second interlayer dielectric layer 124 may be formed, for example, by chemical vapor deposition. In some embodiments, before the second interlayer dielectric layer 124 is formed, a protective layer may be formed to cover the sidewalls of the magnetic tunnel junction pattern MTJP. For example, the protective layer may include silicon nitride or aluminum oxide.

A Bit line BL is formed on the top electrode TE. The bit line BL may be formed of metal, metal nitride, or doped semiconductor. For example, the bit line BL may be formed by sputtering or chemical vapor deposition.

Figure 14:
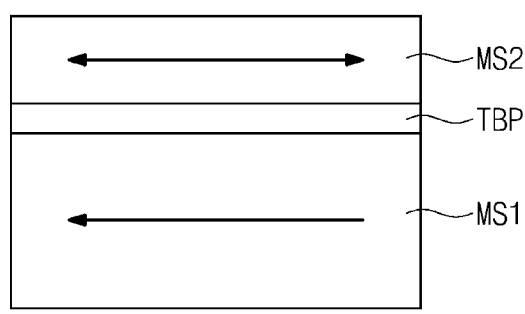
FIGS. 14 and 15 illustrate conceptual diagrams showing a magnetic tunnel junction pattern according to exemplary embodiments of the present inventive concepts.
Figure 15:
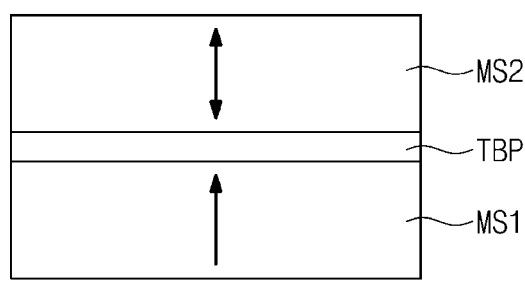

FIGS. 14 and 15 illustrate conceptual diagrams showing a magnetic tunnel junction pattern according to exemplary embodiments of the present inventive concepts. The magnetic tunnel junction pattern MTJP may include a first magnetic pattern MS1, a tunnel barrier pattern TBP, and a second magnetic pattern MS2. One of the first and second magnetic patterns MS1 and MS2 may be a free pattern of the magnetic tunnel junction pattern MTJ, and the other of the first and second magnetic patterns MS1 and MS2 may be a pinned pattern of the magnetic tunnel junction pattern MTJP. For brevity of the description, it will be assumed that the first magnetic pattern MS1 is a pinned pattern and the second magnetic pattern MS2 is a free pattern. Alternatively, the first magnetic pattern MS1 may be a free pattern and the second magnetic pattern MS2 may be a pinned pattern. An electrical resistance of the magnetic tunnel junction pattern MTJP may be dependent on a relative orientation of magnetization directions of the free and pinned patterns. For example, the electrical resistance of the magnetic tunnel junction pattern MTJP may be much greater when the magnetization directions of the free and pinned patterns are antiparallel than when the magnetization directions of the free and pinned patterns are parallel. In conclusion, the electrical resistance of the magnetic tunnel junction pattern MTJP may be controlled by changing the magnetization direction of the free pattern, which may be used as a data storage mechanism for magnetic memory devices according to exemplary embodiments of the present inventive concepts.

Referring to FIG. 14, the first and second magnetic patterns MS1 and MS2 may be magnetic layers for forming a structure with in-plane magnetization substantially parallel to a top surface of the tunnel barrier pattern TBP. In these embodiments, the first magnetic pattern MS1 may include a layer having an anti-ferromagnetic material and a layer having a ferromagnetic material. The layer having an anti-ferromagnetic material may include PtMn, IrMn, MnO, MnS, MnTe, $MnF_2$, $FeCl_2$, FeO, $CoCl_2$, CoO, $NiCl_2$, NiO, or Cr. In some embodiments, the layer having an anti-ferromagnetic material may include at least one of precious metals. The precious metals may include ruthenium (Ru), rhodium (Rh), palladium (Pd), osmium (Os), iridium (Ir), platinum (Pt), gold (Au), or silver (Ag). The layer including a ferromagnetic material may include CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$.

The second magnetic pattern MS2 may include a material having a changeable magnetization direction. The second magnetic pattern MS2 may include a ferromagnetic material. For example, the second magnetic pattern MS2 may include CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$.

The second magnetic pattern MS2 may include a plurality of layers. For example, the second magnetic pattern MS2 may include a plurality of layers having a plurality of ferromagnetic materials and a layer having a non-magnetic material between the plurality of layers. In this case, the layers having the ferromagnetic materials and the layer having the non-magnetic material may constitute a synthetic anti-ferromagnetic layer. The synthetic anti-ferromagnetic layer may reduce critical current density and enhance thermal stability of magnetic memory devices.

The tunnel barrier pattern TBP may include oxide of magnesium (Mg), oxide of titanium (Ti), oxide of aluminum (Al), oxide of magnesium-zinc (MgZn), oxide of magnesium-boron (MgB), nitride of titanium (Ti), and nitride of vanadium (V). For example, the tunnel barrier pattern TBP may be one single layer of magnesium oxide (MgO). Alternatively, the tunnel barrier pattern TBP may include a plurality of layers. The tunnel barrier pattern TBP may be formed using chemical vapor deposition (CVD).

Referring to FIG. 15, the first and second magnetic patterns MS1 and MS2 may include a structure with perpendicular magnetization substantially perpendicular to a top surface of the tunnel barrier pattern TBP. In these embodiments, the first and second magnetic patterns MS1 and MS2 may include a material having an $L_{10}$ crystal structure, a material having a hexagonal close-packed lattice, and an amorphous RE-TM (Rare Earth Transition Metal) alloy. For example, the first and second magnetic patterns MS1 and MS2 may include a material having an $L_{10}$ crystal structure such as $Fe_{50}Pt_{50}$, $Fe_{50}Pd_{50}$, $Co_{50}Pt_{50}$, $Co_{50}Pd_{50}$, and $Fe_{50}Ni_{50}$. Alternatively, the first and second magnetic patterns MS1 and MS2 may include a $Co_3Pt$ ordered alloy or a cobalt-platinum (CoPt) disordered alloy, in which platinum (Pt) is contained to have a content ranging from 10 to 45 at % having a hexagonal close-packed lattice. Alternatively, the first and second magnetic patterns MS1 and MS2 may include an amorphous RE-TM alloy, which contains iron (Fe), cobalt (Co), or nickel (Ni) and a rare-earth metal such as terbium (Tb), dysprosium (Dy), and gadolinium (Gd).

The first and second magnetic patterns MS1 and MS2 may include a material exhibiting interface perpendicular magnetic anisotropy. The interface perpendicular magnetic anisotropy may refer to a phenomenon where a magnetic layer having an intrinsic in-plane magnetization property has a perpendicular magnetization direction due to an effect from an interface with another layer adjacent to the magnetic layer. The term "intrinsic in-plane magnetization property" may mean that a magnetic layer has a magnetization direction parallel to its widest surface (or its longitudinal direction) when there is no external factor. For example, when a substrate is provided thereon with a magnetic layer having the intrinsic in-plane magnetization property and no external factor is applied, a magnetization direction of the magnetic layer may be oriented substantially parallel to a top surface of the substrate.

For example, the first and second magnetic patterns MS1 and MS2 may include cobalt (Co), iron (Fe), or nickel (Ni). The first and second magnetic patterns MS1 and MS2 may further include a non-magnetic material including boron (B), zinc (Zn), aluminum (Al), titanium (Ti), ruthenium (Ru), tantalum (Ta), silicon (Si), silver (Ag), gold (Au), copper (Cu), carbon (C), nitrogen (N), or any combination thereof. For example, the first and second magnetic patterns MS1 and MS2 may include CoFe or NiFe, and may further include boron (B). Additionally, to reduce saturation magnetization, the first and second magnetic patterns MS1 and MS2 may further include titanium (Ti), aluminum (Al), silicon (Si), magnesium (Mg), tantalum (Ta), or silicon (Si). The first and second magnetization patterns MS1 and MS2 may be formed using sputtering or chemical mechanical deposition (CVD).

According to embodiments of the present inventive concepts, a patterning process may be easily performed to form a first bottom electrode and a second bottom electrode, while enhancing characteristics of a magnetic layer formed on the first and second bottom electrode.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A magnetic memory device, comprising:
   a bottom electrode on a substrate;
   an interlayer dielectric layer between the substrate and the bottom electrode;
   a contact plug in the interlayer dielectric layer, a top surface of the contact plug contacting a bottom surface of the bottom electrode and having a width that is less than a width of the bottom electrode;

a magnetic tunnel junction pattern including a first magnetic pattern, a tunnel barrier pattern, and a second magnetic pattern that are sequentially stacked on the bottom electrode; and a top electrode on the magnetic tunnel junction pattern, wherein the bottom electrode comprises a first bottom electrode comprising a nitride of a first metal and a second bottom electrode comprising a nitride of a second metal that is different from the first metal, the second bottom electrode being on the first bottom electrode, wherein the first bottom electrode has a crystallinity higher than that of the second bottom electrode, and wherein the first bottom electrode has a Full Width at Half Maximum (FWHM) of X-Ray Diffraction (XRD) intensity peak that is less than that of the second bottom electrode.

2. The magnetic memory device of claim 1,
wherein the first bottom electrode has a top surface whose roughness is higher than that of a top surface of the second bottom electrode.

3. The magnetic memory device of claim 1,
wherein the first bottom electrode has a columnar structure, and
wherein grains of the first bottom electrode have a major axis in a vertical direction.

4. The magnetic memory device of claim 1,
wherein the first bottom electrode has an NaCl crystalline structure.

5. The magnetic memory device of claim 4,
wherein the first bottom electrode comprises TiN.

6. The magnetic memory device of claim 1,
wherein the second bottom electrode is amorphous.

7. The magnetic memory device of claim 6,
wherein the second bottom electrode comprises TaN or WN.

8. The magnetic memory device of claim 1,
wherein the second metal has atomic mass greater than that of the first metal.

9. The magnetic memory device of claim 1,
wherein the second bottom electrode is thinner than the first bottom electrode.

10. The magnetic memory device of claim 9,
wherein the first bottom electrode has a thickness about 2 times to about 10 times that of the second bottom electrode.

11. The magnetic memory device of claim 9,
wherein the top electrode comprises a metal nitride pattern, and
wherein the second bottom electrode has a thickness less than that of the metal nitride pattern.

12. The magnetic memory device of claim 9,
wherein the second bottom electrode is thicker than the tunnel barrier pattern.

13. A magnetic memory device, comprising:
a bottom electrode on a substrate;
an interlayer dielectric layer between the substrate and the bottom electrode;
a contact plug in the interlayer dielectric layer, a top surface of the contact plug contacting a bottom surface of the bottom electrode and having a width less than a width of the bottom surface of the bottom electrode;
a magnetic tunnel junction pattern including a first magnetic pattern, a tunnel barrier pattern, and a second magnetic pattern that are sequentially stacked on the bottom electrode; and
a top electrode on the magnetic tunnel junction pattern,
wherein the bottom electrode comprises a first bottom electrode comprising a nitride of a first metal and a second bottom electrode comprising a nitride of a second metal that is different from the first metal, the second bottom electrode being on the first bottom electrode,
wherein the second bottom electrode is thinner than the first bottom electrode, and
wherein the first bottom electrode has a Full Width at Half Maximum (FWHM) of X-Ray Diffraction (XRD) intensity peak that is less than that of the second bottom electrode.

14. The magnetic memory device of claim 13,
wherein the first bottom electrode has crystallinity higher than that of the second bottom electrode.

15. The magnetic memory device of claim 14,
wherein the second bottom electrode is amorphous.

16. The magnetic memory device of claim 13,
wherein the second bottom electrode is thicker than the tunnel barrier pattern.

17. The magnetic memory device of claim 13,
wherein the metal nitride of the first bottom electrode comprises a first metal,
wherein the metal nitride of the second bottom electrode comprises a second metal, and
wherein the second metal has atomic mass greater than that of the first metal.

18. The magnetic memory device of claim 13,
wherein a bottom surface of the first bottom electrode is in contact with a top surface of the contact plug and a top surface of the interlayer dielectric layer.

19. A magnetic memory device, comprising:
a bottom electrode on a substrate;
a magnetic tunnel junction pattern including a first magnetic pattern, a tunnel barrier pattern, and a second magnetic pattern that are sequentially stacked on the bottom electrode; and
a top electrode on the magnetic tunnel junction pattern,
wherein the bottom electrode comprises a first bottom electrode and a second bottom electrode, the first bottom electrode comprising a first surface, a second surface opposite the first surface, a third surface and a fourth surface opposite the third surface, the third surface and the fourth surface extending between the first surface and the second surface, the first surface contacting the substrate and second surface contacting the second bottom electrode,
wherein each of the first and second bottom electrodes comprises metal nitride,
wherein the first bottom electrode comprises a crystallinity greater than that of the second bottom electrode, and
wherein the first bottom electrode comprises grains having lengths extending in a direction between the first surface and the second surface and having widths extending between the third surface and the fourth surface, lengths of the grains being at least three times greater than widths of the grains.

* * * * *